US012663446B2

(12) United States Patent
Tamura et al.

(10) Patent No.: US 12,663,446 B2
(45) Date of Patent: Jun. 23, 2026

(54) CURRENT SENSOR

(71) Applicant: Alps Alpine Co., Ltd., Tokyo (JP)

(72) Inventors: Manabu Tamura, Miyagi-ken (JP);
Chiaki Ueda, Miyagi-ken (JP)

(73) Assignee: Alps Alpine Co., Ltd., Tokyo (JP)

( * ) Notice: Subject to any disclaimer, the term of this
patent is extended or adjusted under 35
U.S.C. 154(b) by 192 days.

(21) Appl. No.: 18/767,125

(22) Filed: Jul. 9, 2024

(65) Prior Publication Data

US 2024/0361362 A1     Oct. 31, 2024

Related U.S. Application Data

(63) Continuation    of    application    No.
PCT/JP2022/045525, filed on Dec. 9, 2022.

(30) Foreign Application Priority Data

Feb. 4, 2022    (JP) ................................. 2022-016502

(51) Int. Cl.
　G01R 19/00　　　(2006.01)
　G01R 1/07　　　(2006.01)
　G01R 1/18　　　(2006.01)
(52) U.S. Cl.
　CPC ........... G01R 19/0092 (2013.01); G01R 1/07
　　　(2013.01); G01R 1/18 (2013.01)
(58) Field of Classification Search
　CPC ......... G01R 19/0092; G01R 1/07; G01R 1/18
　See application file for complete search history.

(56) References Cited

U.S. PATENT DOCUMENTS

| | | | |
|---|---|---|---|
| 10,267,826 B2 | 4/2019 | Harada | |
| 11,209,466 B2 | 12/2021 | Tamura et al. | |
| 2019/0346489 A1* | 11/2019 | Tamura | G01R 19/0092 |
| 2020/0158760 A1* | 5/2020 | Fukuhara | G01R 15/207 |

(Continued)

FOREIGN PATENT DOCUMENTS

| | | |
|---|---|---|
| JP | H08-075817 | 3/1996 |
| JP | 2016-001168 | 1/2016 |
| JP | 2016-148620 | 8/2016 |

(Continued)

OTHER PUBLICATIONS

Translation of WO-2015178478-A1 (Year: 2015).*
International Search Report from International Application No.
PCT/JP2022/045525 dated Feb. 21, 2023 with machine translation.

*Primary Examiner* — Paresh Patel
(74) *Attorney, Agent, or Firm* — Beyer Law Group LLP

(57)　　　　　ABSTRACT

A current sensor includes units each of which has a bus bar
through which current flows, a magnetic sensor facing one
of plate surfaces of the bus bar, a shield facing the other plate
surface. The units have a large-current unit and a small-
current unit. A first distance between the bus bar and the
magnetic sensor in a normal direction of the plate surfaces
of the bus bar is the same as a distance L1A of the
large-current unit and a distance L1B of the small-current
unit. Since, as for a second distance between the bus bar and
a base of the shield, a distance L2A of the large-current unit
is larger than a distance L2B of the small-current unit, a
measurement range of the large-current unit is widened and
a measurement error due to magnetic saturation of the shield
is suppressed.

8 Claims, 9 Drawing Sheets

(56)          References Cited

U.S. PATENT DOCUMENTS

| | | | |
|---|---|---|---|
| 2022/0229093 A1 | 7/2022 | Tamura | |
| 2023/0092098 A1* | 3/2023 | Tamura | G01R 15/207 |
| | | | 324/117 R |

FOREIGN PATENT DOCUMENTS

| | | |
|---|---|---|
| JP | 2020-115104 | 7/2020 |
| WO | 2018/150802 | 8/2018 |
| WO | 2021/070834 | 4/2021 |

* cited by examiner

CURRENT SENSOR

CLAIM OF PRIORITY

This application is a Continuation of International Application No. PCT/JP2022/045525 filed on Dec. 9, 2022, which claims benefit of Japanese Patent Application No. 2022-016502 filed on Feb. 4, 2022. The entire contents of each application noted above are hereby incorporated by reference.

BACKGROUND OF THE INVENTION

1. Field of the Invention

The present invention relates to a current sensor that measures a measurement-target current flowing through a bus bar based on magnetism.

2. Description of the Related Art

In recent years, as a demand for decarbonization has increased, a shift from engines to motors, that is, a shift to gasoline-free vehicles/electric vehicles (EV shift), has progressed in order to curb $CO_2$ emissions in automobile driving. Inverter-power control units (PCUs) that integrate inverters and boost converters compatible with mounting of a plurality of motors have been put into practical use in electric vehicles/hybrid electric vehicles (EV/HEV). In this way, there is a need for a current sensor which measures currents of different magnitudes and which are used to measure motor currents of different capacities and currents in a boost section.

In order to miniaturize a PCU, a plurality of detection units are required to be integrated. However, when measurement-target currents of different magnitudes are applied to the different detection units, problems may occur such as being out of a measurement range of a magnetic sensor in the detection unit where a large magnitude of current is applied, or errors may occur due to magnetic saturation of shields of the detection units and other influence of the detection units.

In Japanese Unexamined Patent Application Publication No. 2016-1168, for the purpose of providing a current sensor capable of obtaining a wide dynamic range of input current, it is described that a plurality of magnetoresistive elements are disposed at positions having different distances from a current center in a current sensor for detecting magnetism generated by current.

In the current sensor described in Japanese Unexamined Patent Application Publication No. 2016-1168, a magnetoresistive element for a large current and a magnetoresistive element for a small current are disposed and a position relative to a conductor is designed to constitute a current detector of the current sensor having a wide dynamic range. However, there arises a problem in that, when different magnetoresistive elements are used for a large current and a small current, a configuration of the current sensor becomes complicated.

SUMMARY OF THE INVENTION

The present invention provides a current sensor in which a large-current unit through which a large current flows and a small-current unit through which a small current flows are integrated, a wide measurement range for the large-current unit is attained, and measurement errors due to magnetic saturation of shields or other influence of the detection units are suppressed.

The present invention provides the following configuration as means for solving the above-mentioned problem.

A current sensor has a plurality of units which are integrally formed and each of which has a bus bar of a flat plate shape which allows current to flow and which extends in a first direction, a magnetic sensor disposed so as to face one of plate surfaces of the bus bar, and a shield having a base of a flat plate shape which is disposed so as to face the other plate surface of the bus bar. Each of the plurality of units includes a large-current unit in which relatively large current flows in the bus bar and a small-current unit in which relatively small current flows in the bus bar. When a direction normal to the plate surfaces of the bus bar is determined as a second direction and a direction orthogonal to the first direction and the second direction is determined as a third direction, a first distance between the bus bar and the magnetic sensor in the second direction is the same for the large-current unit and the small-current unit, and a second distance between the bus bar and the base in the second direction of the large-current unit is larger than that of the small-current unit.

By increasing the second distance, a function of the shield to enhance the magnetism generated by the current flowing through the bus bar becomes smaller, so that a range of the current measurable by the large-current unit may be enlarged. In addition, a measurement error of the current sensor may be suppressed by suppressing magnetic saturation of the shield by the magnetism from the bus bar.

The large-current unit and the small-current unit may have the same bus bar, the same magnetic sensor and the same shield. By using the common components in the large-current unit and the small-current unit, manufacturing cost of the current sensor may be suppressed.

The shield may have, at opposite ends of the base in the third direction, standing portions extending to a side where the bus bar and the magnetic sensor are arranged in the second direction. Furthermore, end portions of the shield may be located between the magnetic sensor and the bus bar in the second direction.

With the above configuration, the measurable current range of the large-current unit and the small-current unit may be adjusted by adjusting an effect of enhancing the magnetism generated by the current flowing through the bus bar with the shield. Accordingly, noise immunity is improved.

The current sensor may include a large-current unit group having the plurality of large-current units arranged at an interval $a1$ in the third direction, and a small-current unit group having the plurality of small-current units arranged at an interval $a2$ in the third direction. One of the large-current units and one of the small-current units may be arranged adjacent to each other with an interval b. In the large-current unit group, the bus bars of the large-current units may be arranged on a plane A. In the small-current unit group, the bus bars of the small-current units may be arranged on a plane B. The plane A and the plane B may be the same plane. The interval b may be larger than the interval $a1$. The interval b may be larger than the interval $a2$.

The current sensor may include a large-current unit group having the plurality of large-current units arranged at an interval $a1$ in the third direction, and a small-current unit group having the plurality of small-current units arranged at an interval $a2$ in the third direction. One of the large-current units and one of the small-current units may be arranged adjacent to each other with an interval b. In the large-current unit group, the bus bars of the large-current units may be arranged on a plane A. In the small-current unit group, the bus bars of the small-current units may be arranged on a plane B. The plane A and the plane B may be different from each other. The interval b may be equal to or larger than the interval a1. The interval b may be equal to or larger than the interval a2.

By increasing the interval b between the large-current current unit and the small-current current unit to be larger than the intervals a1 and a2 between the same current units, influence of magnetism caused by the current flowing through the bus bar of the large-current unit on the small-current unit adjacent to the large-current unit may be suppressed.

When the plane A and the plane B are the same plane, a size of the current sensor in the second direction may be reduced, and when the plane A and the plane B are different planes, a size of the current sensor in the third direction may be reduced.

In the current sensor, the plurality of units may be arranged in the third direction. When magnitudes of currents flowing through the bus bars of the adjacent units are different from each other, the adjacent units may be arranged on the same straight line extending in the third direction. When magnitudes of currents flowing through the bus bars of the adjacent units are the same as each other, the adjacent units may be arranged on the same straight line extending in the third direction.

Therefore, influence of a magnetism caused by current flowing through the bus bar of the large-current unit on the magnetic sensor of the small-current unit which is arranged adjacent to the large-current unit may be suppressed by the shield.

The current sensor may include a large-current unit group having the plurality of large-current units and a small-current unit group having the plurality of small-current units. In the large-current unit group, the bus bars of the large-current units may be arranged on a plane A. In the small-current unit group, the bus bars of the small-current units may be arranged on a plane B. The plane A and the plane B may be the same plane. In the large-current unit group, the adjacent large-current units may not be arranged on the same straight line extending in the third direction. In the small-current unit group, the adjacent small-current units may not be arranged on the same straight line extending in the third direction. One of the large-current units and one of the small-current units may be arranged adjacent to each other on the same straight line extending in the third direction.

The current sensor may include a small-current unit group having the plurality of small-current units and the large-current unit. The bus bar of the large-current unit may be arranged on a plane A. In the small-current unit group, the bus bars of the small-current units may be arranged on a plane B. The plane A and the plane B may be the same plane. In the small-current unit group, the adjacent small-current units may not be arranged on the same straight line extending in the third direction. The large-current unit and one of the small-current units may be arranged adjacent to each other on the same straight line extending in the third direction.

With the above configuration, the distance between the units in the third direction may be reduced and the current sensor may be miniaturized.

The current sensor may further include a medium-current unit in which current of a magnitude between a current value of current flowing through the large-current units and a current value of current flowing through the small-current units flows.

By increasing the second distance, a range of the measurable current may be widened by the large-current unit, and saturation of the shield due to magnetism caused by current may be suppressed. Therefore, a current sensor including a large-current unit and a small-current unit which are integrated, with a wide measurable current range and a small measurement error, may be provided.

DESCRIPTION OF THE PREFERRED EMBODIMENTS

Figure 1A:
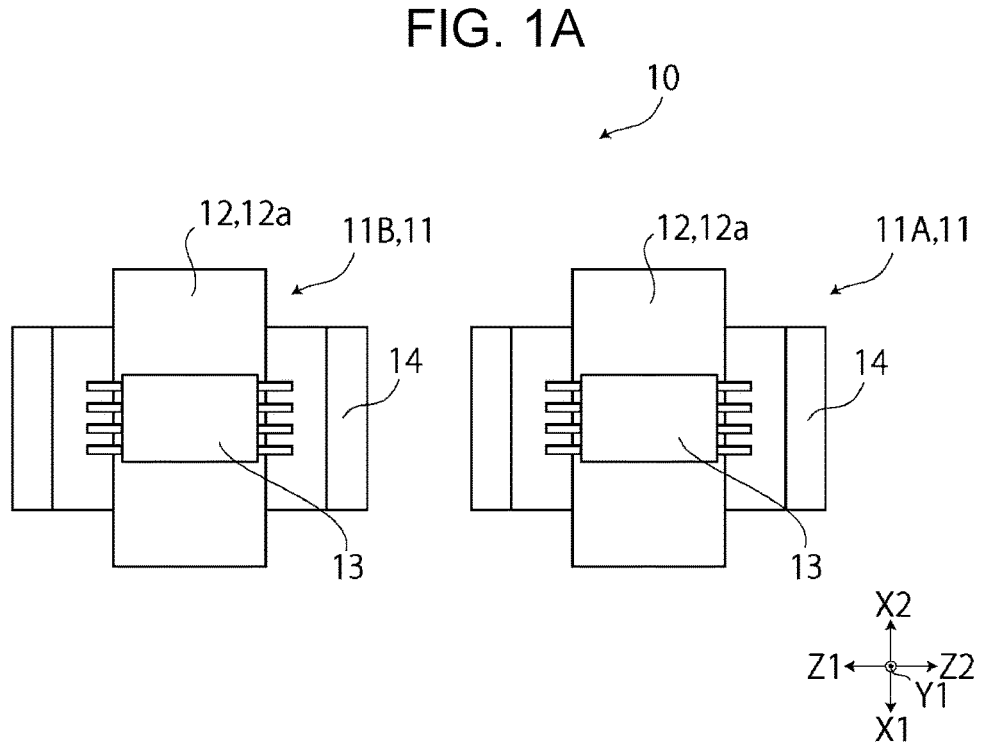
FIG. 1A is a plan view schematically illustrating an important portion of a current sensor according to a first embodiment.

Hereinafter, an embodiment of the present invention will be described with reference to the accompanying drawings. In the individual drawings, the same reference numerals are given to the same components, and descriptions thereof are omitted accordingly. In the individual drawings, an X-Y-Z coordinate is illustrated as a reference coordinate.

First Embodiment

Figure 1B:
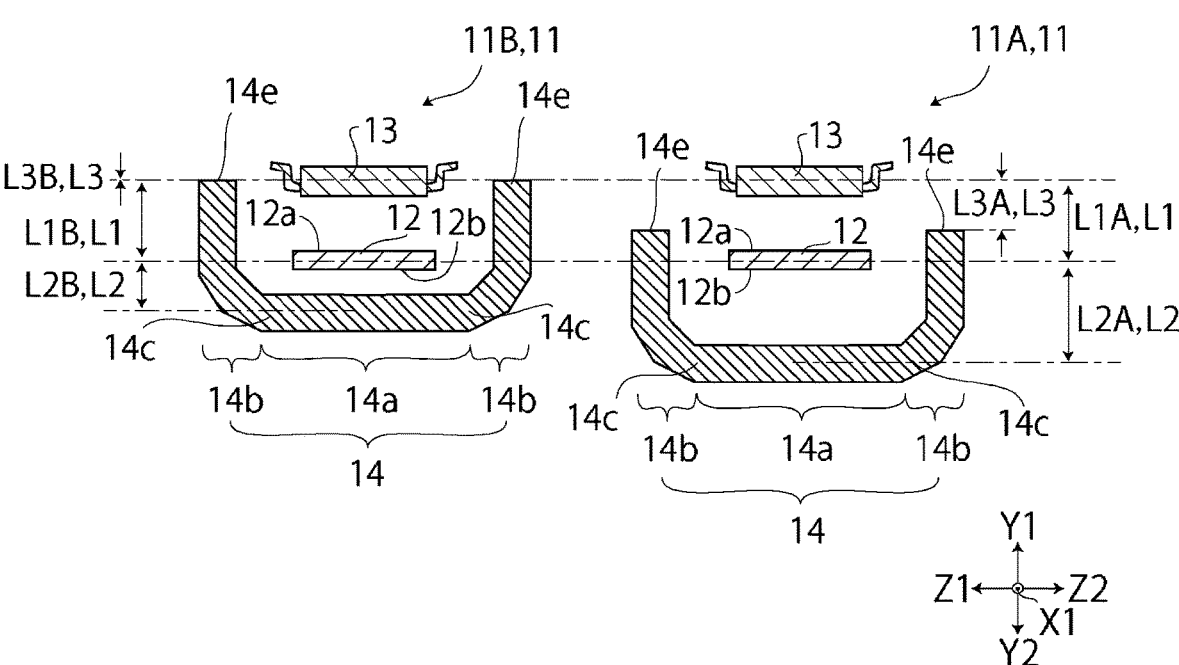
FIG. 1B is a cross-sectional view schematically illustrating the important portion of the current sensor according to a first embodiment.

FIGS. 1A and 1B are a plan view and a cross-sectional view, respectively, schematically illustrating an important portion of a current sensor 10 according to this embodiment. As illustrated in FIGS. 1A and 1B, the current sensor 10 includes a plurality of units 11, and the plurality of units 11 are integrated. Each of the plurality of units 11 has a bus bar 12, a magnetic sensor 13, and a shield 14. In the present invention, a direction in which the bus bar 12 extends (first direction) is determined as an X-axis direction, a direction normal to plate surfaces 12a and 12b of the bus bar 12 (second direction) is determined as a Y-axis direction, and a direction orthogonal to the first direction and the second direction (third direction) is determined as a Z-axis direction.

The bus bar 12 has a flat plate shape, extends in the first direction (in the X-axis direction), allows current to be detected to flow, and is composed of copper, brass, aluminum, or the like. Note that the bus bar 12 may not have the flat plate shape and may be bent at a portion other than portions facing the magnetic sensor 13 and the shield 14.

The magnetic sensor 13 is positioned so as to face the plate surface 12a which is one (on a side in a Y-axis direction Y1) of the plate surfaces of the bus bar 12, and is mounted on a substrate, not illustrated, to detect magnetism caused by a measurement target current flowing through the bus bar 12. As the magnetic sensor 13, for example, a magnetoresistive effect element, such as a GMR element or a TMR element, using a magnetoresistive effect in which an electrical resistance changes depending on an external magnetic field is used.

The shield 14 has a flat base 14a disposed so as to face the plate surface 12b of the other side of the bus bar 12 (Y-axis direction Y2 side). In addition, the shield 14 has standing portions 14b extending from opposite ends 14c of a base 14a in the third direction (Z-axis direction) to one side in the second direction (Y-axis direction). Note that the one side in the second direction is a side where the bus bar 12 and the magnetic sensor 13 are arranged in relation to the base 14a when the shield 14 is incorporated as the unit 11. The shield 14 suppresses electromagnetic interference caused by the bus bar 12. For example, the shield 14 is configured by stacking a plurality of metal plates of the same shape.

The plurality of units 11 include a large-current unit 11A in which relatively large current flows in the bus bar 12 and a small-current unit 11B in which relatively small current flows in the bus bar 12. When the large-current unit 11A and the small-current unit 11B are not distinguished from one another, each of them are referred to as the unit 11 where appropriate.

Note that, in this embodiment, as for the bus bar 12, the magnetic sensor 13, and the shield 14, the same configuration is employed in the large-current unit 11A and the small-current unit 11B of the current sensor 10. Since the same members are used in the individual units 11, manufacturing cost of the current sensor 10 may be suppressed. In the description of this embodiment, the same bus bar 12 means that portions where the magnetic sensor 13 and the shield 14 overlap with the bus bar 12 are the same in the second direction (Y-axis direction). Therefore, the bus bars 12 may have different lengths and different end shapes in the first direction (X-axis direction).

As a distance (first distance) L1 between the bus bar 12 and the magnetic sensor 13 in the second direction, a distance L1A in the large-current unit 11A is the same as a distance L1B in the small-current unit 11B. In contrast, as a distance (second distance) L2 between the bus bar 12 and the base 14a of the shield 14 in the second direction, a distance L2A in the large-current unit 11A is larger than a distance L2B in the small-current unit 11B. Furthermore, in the second direction, as a distance (third distance) L3 between an end portion 14e of the shield 14 (standing portion 14b) and the magnetic sensor 13, a distance L3A in the large-current unit 11A is larger than a distance L3B in the small-current unit 11B. Note that the distance L3B is 0 in FIG. 1B. In the present invention, the distances L1, L2, and L3 between the corresponding members are distances between centers of the corresponding members in the second direction.

The shield 14 also functions as a yoke for magnetism (induced magnetic field) generated by the current flowing through the bus bar 12, and the magnetism emitted from the end portion 14e of the shield 14 is measured by the magnetic sensor 13. Therefore, a magnitude of the magnetism caused by the current of the bus bar 12 measured by the magnetic sensor 13 may be adjusted by the distances L2 and L3. In other words, when the distances L2 and L3 are increased, an effect of the shield 14 to strengthen the magnetism caused by the current of the bus bar 12 may be suppressed and the magnetism reaching the magnetic sensor 13 may be reduced.

By making the shield 14 for the large-current unit 11A and the shield 14 for the small-current unit 11B different in shape, a difference may be made between the distance L2 and the distance L3 between the large-current unit 11A and the small-current unit 11B. However, in the present application, the shield 14 for the large-current unit 11A and the shield 14 for the small-current unit 11B are configured by the same components.

In other words, since a difference between the distances L2 also causes a difference between the distances L3 of the magnetic sensor 13 and the end portion 14e of the shield 14, the effect of enhancing the magnetism generated by the current of the bus bar 12 may be differentiated using the same shield 14. Since the distance L3 increases when the distance L2 is increased, the effect of increasing the magnetism of the shield 14 in the large-current unit 11A may be suppressed. By increasing the distances L2 and L3, the magnetism reaching the magnetic sensor 13 may be reduced when a large current is applied to the bus bar 12. Therefore, a range of current flowing through the bus bar 12 measurable by the large-current unit 11A may be increased.

Furthermore, by increasing the distance L2, magnetic saturation of the shield 14 caused by the magnetism from the bus bar 12 may be suppressed. Therefore, the current sensor 10 having a small current detection error by maintaining a function of suppressing magnetism of the shield 14 may be attained.

Moreover, since the end portion 14e of the shield 14 (standing portion 14b) is located between the magnetic sensor 13 and the bus bar 12 in the second direction, the magnetism generated by the current flowing through the bus bar 12 may be enhanced by the shield 14. When the end portion 14e is positioned between the magnetic sensor 13 and the bus bar 12 in the second direction, the end portions 14e are located between a center point of the magnetic sensor 13 and a center point of the bus bar 12 in the second direction. Therefore, as illustrated in FIG. 1B, a case where the center point of the magnetic sensor 13 and the end portions 14e are located in the same position in the second direction is also included. The end portions 14e of the shield 14 are not the ends 14c of the opposite sides of the shield 14 in the Z-axis direction, but tip ends of the standing portions 14b on the Y1 side in the Y-axis direction.

In the current sensor 10, with respect to the distance L3 between the magnetic sensor 13 and the end portions 14e of the shield 14 in the second direction (Y-axis direction), the distance L3A of the large-current unit 11A is larger than the distance L3B of the small-current unit 11B. With this configuration, using the same shield 14, the effect of enhancing the magnetism generated by the current flowing through the bus bar 12 is differentiated between the large-current unit 11A and the small-current unit 11B. When the effect of enhancing the magnetism of the shield 14 in the large-current unit 11A is smaller than that in the shield 14 in the small-current unit 11B, a range of current measurable by the large-current unit 11A is increased.

<Modification>

Figure 2A:
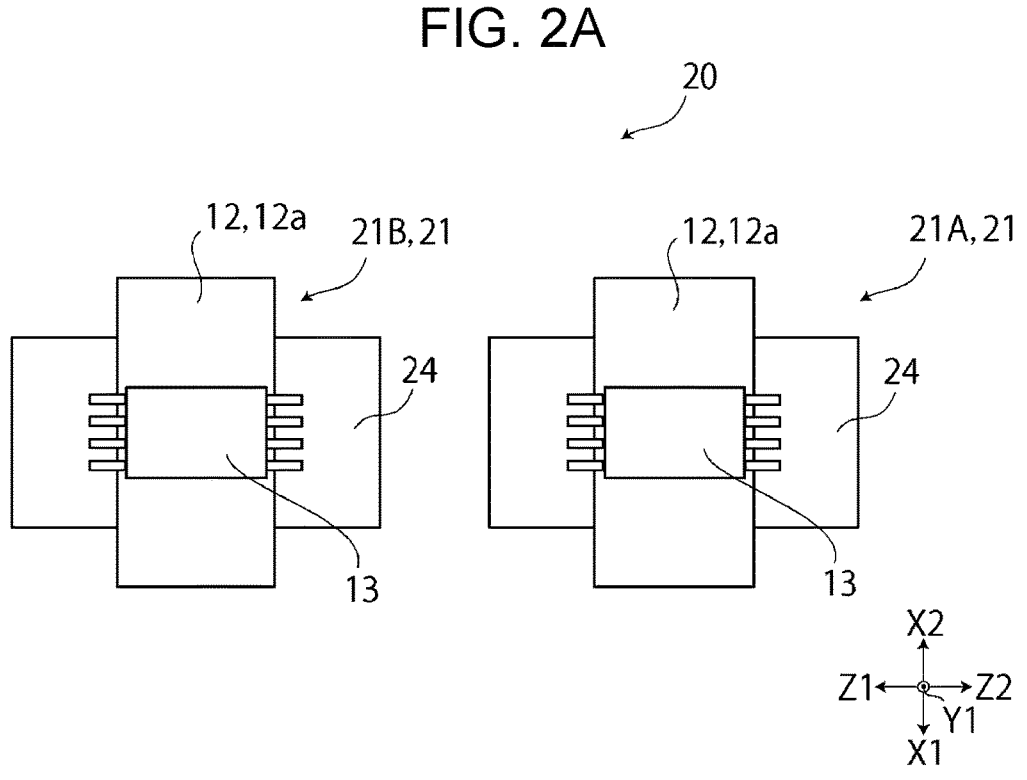
FIG. 2A is a plan view schematically illustrating an important portion of a current sensor according to a modification.
Figure 2B:
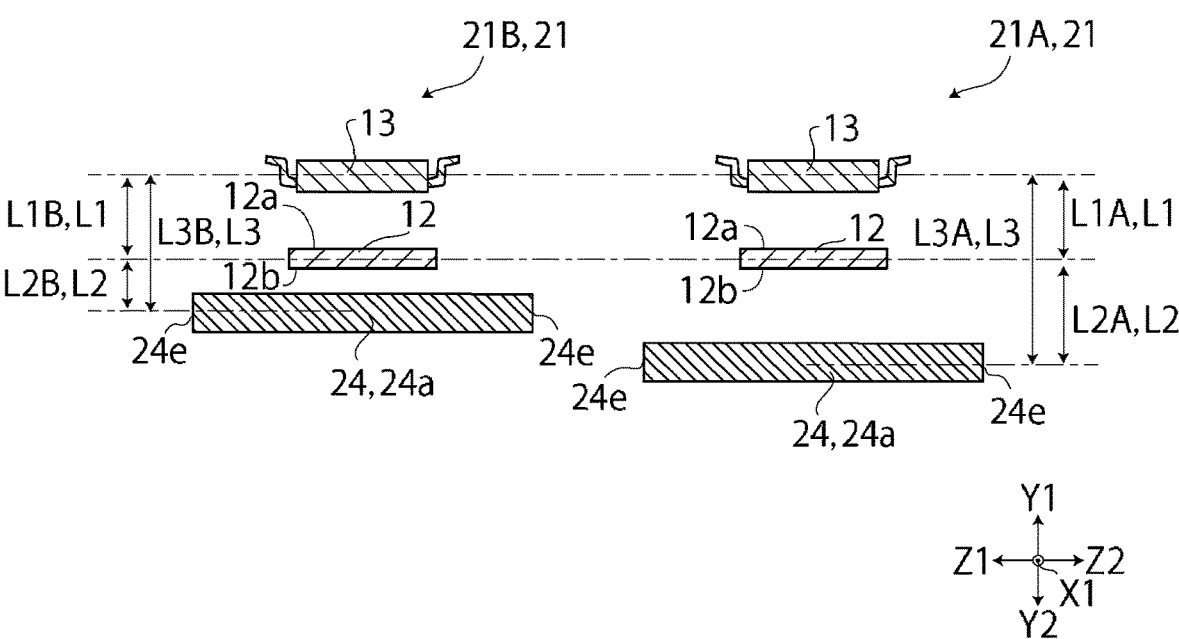
FIG. 2B is a cross-sectional view schematically illustrating the important portion of the current sensor according to the modification.

FIG. 2A is a plan view schematically illustrating an important portion of a current sensor 20 according to a modification, and FIG. 2B is a cross-sectional view thereof. As illustrated in these drawings, each of a large-current unit 21A and a small-current unit 21B (units 21) of a current sensor 20 has a shield 24 in a form of a flat plate only including a base 24a instead of the shield 14 including the standing portions 14b. The current sensor 20 is different from the current sensor 10 in this configuration.

In the current sensor 20, each of the units 21 has a flat shield 24 instead of the shield 14 having a U-shaped cross section in a YZ plane. As a distance L1 between a bus bar 12 and a magnetic sensor 13 in the second direction, a distance L1A in the large-current unit 21A is the same as a distance L1B in the small-current unit 21B. In contrast, as a distance L2 between the bus bar 12 and a base 24a of the shield 24 in the second direction, a distance L2A in the large-current unit 21A is larger than a distance L2B in the small-current unit 21B. Furthermore, as a distance L3 between the magnetic sensor 13 and an end portion 24e of the shield 24, a distance L3A in the large-current unit 21A is larger than a distance L3B in the small-current unit 21B. As a result, as with the current sensor 10, a range of current measurable by the large-current unit 21A of the current sensor 20 is increased, and a detection error of the current may be reduced.

Moreover, although a configuration in which the shield 24 is disposed on an opposite side of the magnetic sensor 13 with the bus bar 12 interposed therebetween is illustrated as a configuration of the units 21 in FIGS. 2A and 2B, the bus bar 12 and the magnetic sensor 13 may be disposed between a pair of shields 24 arranged to face each other in the second direction (Y-axis direction).

Second Embodiment

Figure 3:
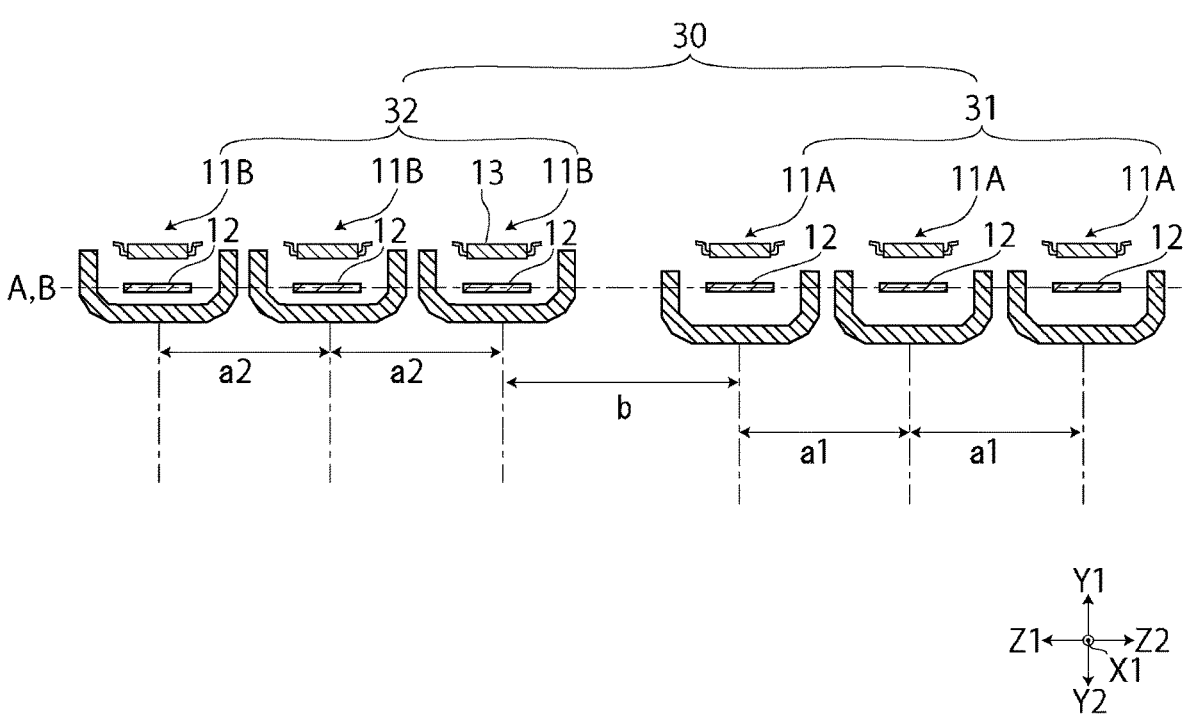
FIG. 3 is a cross-sectional view schematically illustrating the positional relationship of an important portion of a current sensor unit according to a second embodiment.

FIG. 3 is a cross-sectional view schematically illustrating the positional relationship of an important portion of a current sensor 30. The current sensor 30 has a large-current unit group 31 and a small-current unit group 32 which are arranged next to each other in a third direction. The large-current unit group 31 has a plurality of large-current units 11A arranged at intervals a1 in the third direction (Z-axis direction). The small-current unit group 32 has a plurality of small-current units 11B arranged at intervals a2 in the third direction. Furthermore, one of the large-current units 11A and one of the small-current units 11B which are adjacent to each other, i.e., one of the large-current units 11A of the large-current unit group 31 which is positioned closest to the adjacent small-current unit group 32 and one of the small-current units 11B of the small current unit group 32 which is positioned closest to the adjacent large-current unit group 31 are arranged at an interval b in the third direction.

More specifically, in FIG. 3, one of the large-current units 11A which is positioned at an end on a Z1 side in a Z-axis direction which is the third direction and one of the small-current units 11B which is positioned at an end on a Z2 side in the Z-axis direction are arranged at the interval b in the third direction. The term "interval" means a distance between a center point and a center point of the units 11 arranged next to each other in the third direction.

In the large-current unit group 31, bus bars 12 of the large-current units 11A are arranged on a plane A. In the small-current unit group 32, bus bars 12 of the small-current units 11B are arranged on a plane B. The planes A and B are on the same plane, and both are located in an XZ plane. Although, in FIG. 3, the large-current unit group 31 includes the three large-current units 11A and the small-current unit group 32 includes the three small-current units 11B, the numbers of the units 11A and units 11B may be 1, 2, 4 or more.

The interval b between one of the large-current units 11A and one of the small-current units 11B is larger than the intervals a1 of the large-current units 11A and is larger than the intervals a2 of the small-current units 11B. That is, the interval b between the large-current unit 11A and the small-current unit 11B, which are adjacent across a boundary between the large-current unit group 31 and the small-current unit group 32, is wider than the intervals a1 and a2 of the units 11 belonging to the same unit groups. With this configuration, an influence of the magnetism generated by the current flowing through the bus bar 12 of the adjacent units 11 belonging to the different unit groups on the magnetic sensors 13 of the other units 11 may be suppressed. Therefore, the influence from the adjacent unit 11, in particular, influence on the magnetic sensor 13 of the adjacent small-current unit 11B due to the current flowing through the bus bar 12 of the large-current unit 11A, may be suppressed, and a detection error of the current may be reduced.

<Modification>

Figure 4:
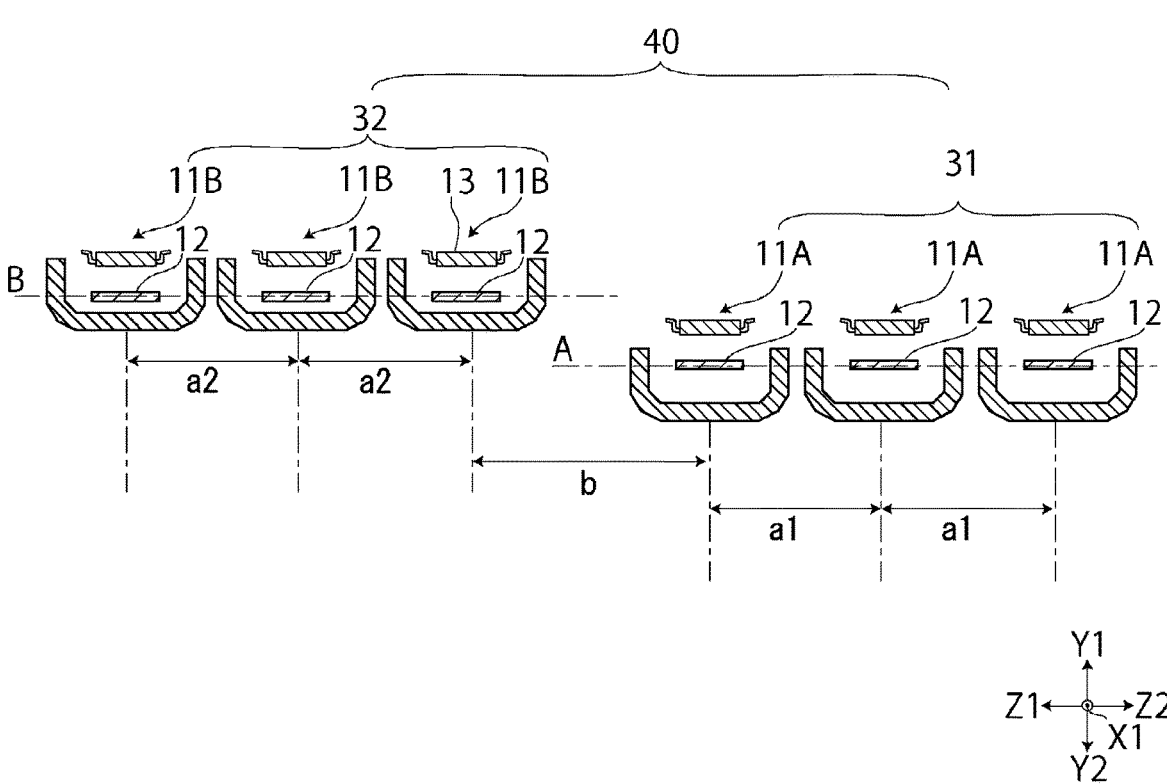
FIG. 4 is a cross-sectional view schematically illustrating the positional relationship of an important portion of a current sensor unit according to a modification.

FIG. 4 is a cross-sectional view schematically illustrating the positional relationship of an important portion of a current sensor 40 according to a modification. The current sensor 40 includes a large-current unit group 31 and a small-current unit group 32. The magnitude relationship among intervals a1 in a Z-axis direction of large-current units 11A, intervals a2 in the Z-axis direction of small-current units 11B, and an interval b in the Z-axis direction of one of the large-current units 11A and one of the small-current units 11B which are adjacent to each other is the same as that of the current sensor 30. A configuration in which a plane A having bus bars 12 of the large-current units 11A arranged thereon and a plane B having bus bars 12 of the small-current units 11B arranged thereon are different from each other is different from that of the current sensor 30.

The current sensor 40 illustrated in FIG. 4 has an interval b which is larger than the intervals a1 and the intervals a2. However, the interval b may be equal to one or both of the intervals a1 and a2. Furthermore, positions of the planes A and B in a Y-axis direction may be opposite to those in FIG. 4.

In the Y-axis direction, the plane A in which the bus bars 12 of the large-current units 11A are arranged is preferably located on an opposite side (Y2 side) of the magnetic sensors 13 of the small-current units 11B relative to the plane B in which the bus bars 12 of the small-current unit 11B are arranged, as illustrated in FIG. 4. Since the bus bars 12 of the large-current units 11A are arranged on the opposite side of the magnetic sensors 13 of the small-current units 11B, a distance between the bus bars 12 of the large-current units 11A and the magnetic sensors 13 of the small-current units 11B may be increased. Therefore, an influence of the magnetism of the bus bar 12 of the large-current unit 11A on the adjacent small-current unit 11B may be suppressed.

Third Embodiment

Figure 5A:
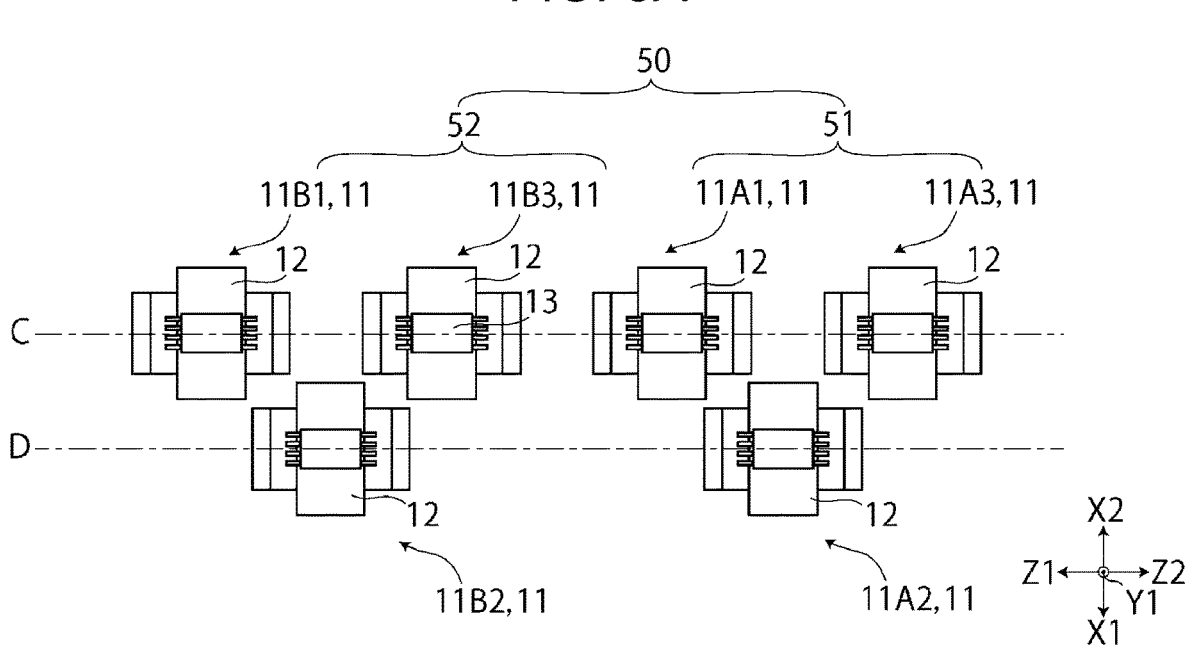
FIG. 5A is a plan view schematically illustrating the positional relationship of an important portion of a current sensor unit according to a third embodiment.
Figure 5B:
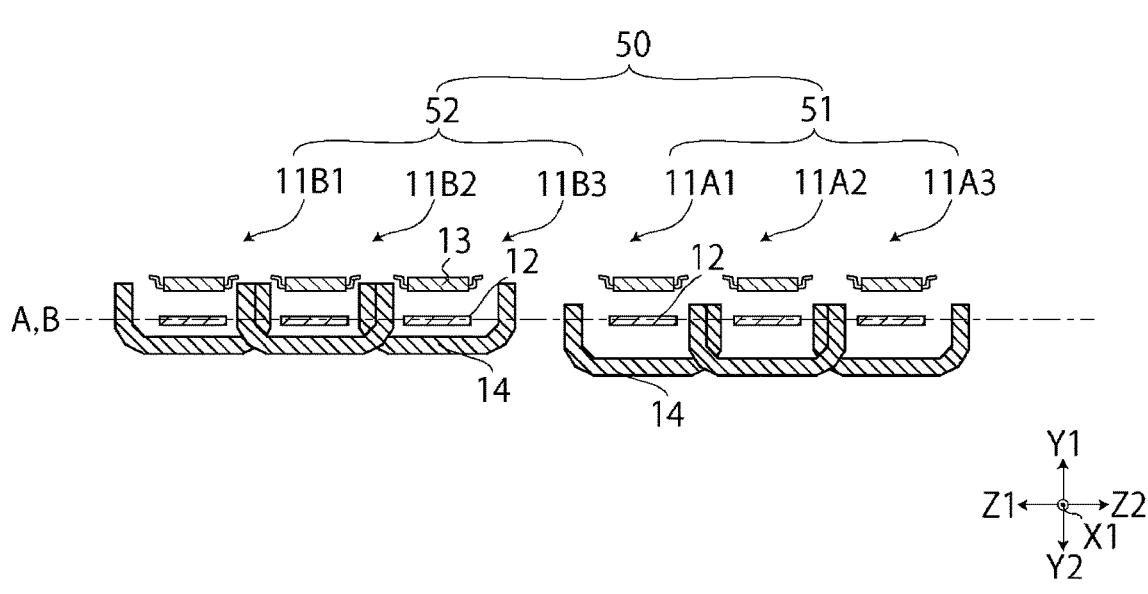
FIG. 5B is a cross-sectional view schematically illustrating the positional relationship of the important portion of the current sensor unit according to the third embodiment.

FIG. 5A is a plan view schematically illustrating the positional relationship of an important portion of a current sensor unit 50 according to a third embodiment, and FIG. 5B is a cross-sectional view thereof. In these drawings, in order to distinguish units 11, large-current units 11A are designated as 11A1, 11A2, and 11A3, and small-current units 11B are designated as 11B1, 11B2, and 11B3 when viewed from a Z1 side to a Z2 side in a Z axis direction.

In the large-current units 11A1, 11A2, and 11A3 arranged in a Z-axis direction (third direction), the adjacent large-current units 11A1 and 11A2 and the adjacent large-current units 11A2 and 11A3 are not arranged on the same straight line. The same straight line is parallel to the Z-axis direction (third direction). The large-current units 11A1 and 11A3 are arranged on opposite sides on a straight line C parallel to the Z axis, and the large-current unit 11A2 is arranged between the units 11A1 and 11A3 on a straight line D parallel to the straight line C.

Similarly, as for the small-current units 11B1, 11B2, and 11B3 arranged in the Z-axis direction, the small-current units 11B1 and 11B2 which are adjacent to each other are not arranged on the same straight line, and the small-current units 11B2 and 11B3 which are adjacent to each other are not arranged on the same straight line. The small-current units 11B1 and 11B3 are arranged on opposite sides on the straight line C parallel to the Z axis, and the small-current unit 11B2 is arranged between the units 11B1 and 11B3 on the straight line D parallel to the straight line C.

In both the large-current unit group 51 and the small-current unit group 52, when a magnitude of the current flowing through the bus bars 12 of the adjacent units 11 is the same, the adjacent units 11 are not arranged on the same straight line extending in the Z-axis direction. With this configuration, sizes of the large-current unit group 51 and the small-current unit group 52 in the Z-axis direction may be reduced.

Furthermore, since two of the units 11 arranged on opposite sides of a certain one of the units 11 are arranged on the same straight line extending in the Z-axis direction in this embodiment, the sizes of the large-current unit group 51 and the small-current unit group 52 in the Z-axis direction may be reduced, and sizes thereof in an X-axis direction may also be reduced.

The large-current unit 11A1 and the small-current unit 11B3 are adjacent units 11 having different magnitudes of current flowing through the respective bus bars 12, and are arranged on the same straight line C extending in the Z-axis direction. With this configuration, shields 14 (standing portions 14b) of the large-current unit 11A1 and the small-current unit 11B3 are arranged in a duplex manner between a bus bar 12 of the large-current unit 11A1 and a magnetic sensor 13 of the small-current unit 11B3 in the Z direction. Therefore, influence of a magnetism caused by current flowing through the bus bar 12 of the large-current unit 11A1 on the magnetic sensor 13 of the small-current unit 11B3 may be suppressed by the shield 14.

In addition, when the shield 14 is in a form of a flat plate constituted only by a base 14a without standing portions 14b, the bus bar 12 and the magnetic sensor 13 may be arranged between a pair of shields 24 (base 14a) so that influence of magnetism caused by the current flowing through the bus bar 12 of the large-current unit 11A1 on the magnetic sensor 13 of the small-current unit 11B3 may be efficiently suppressed.

As illustrated in FIG. 5B, the bus bars 12 of the large-current units 11A1, 11A2, and 11A3 of the large-current unit group 51 are arranged on a plane A parallel to an XZ plane. The bus bars 12 of the small-current units 11B1, 11B2, and 11B3 of the small-current unit group 52 are arranged on a plane B parallel to the XZ plane. When the planes A and B are the same plane, a size of the current sensor 50 in a Y-axis direction may be reduced. However, as illustrated in FIG. 4, the planes A and B may not be the same plane.

<Modification>

Figure 6A:
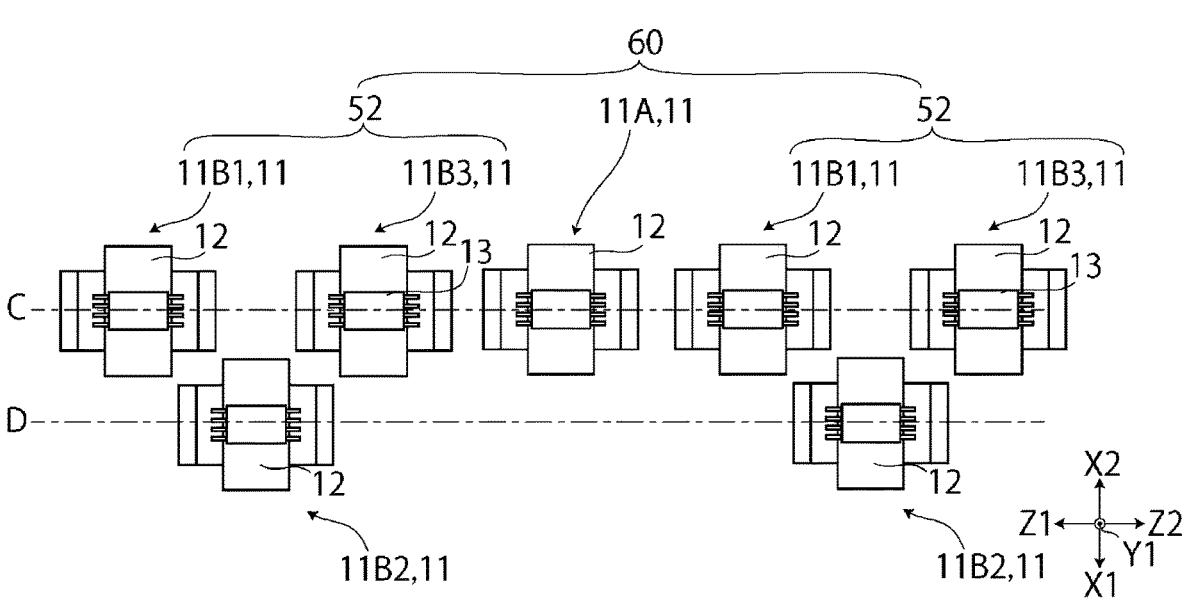
FIG. 6A is a plan view schematically illustrating the positional relationship of an important portion of a current sensor unit according to a modification.
Figure 6B:
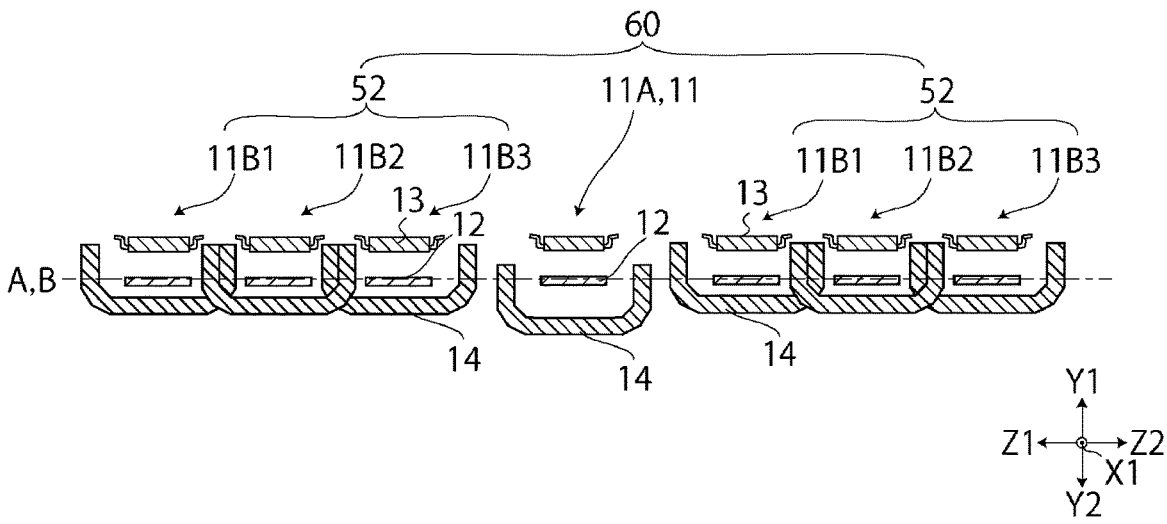
FIG. 6B is a cross-sectional view schematically illustrating the positional relationship of the important portion of the current sensor unit according to the modification.

FIG. 6A is a plan view schematically illustrating the positional relationship of an important portion of a current sensor 60 according to a modification, and FIG. 6B is a cross-sectional view thereof. The current sensor 60 is different from the current sensor 50 in a configuration in which a large-current unit 11A is provided in place of the large-current unit group 51. Also in the case where only one large-current unit 11A is used, among a plurality of small-current units 11B included in two small-current unit groups 52, in a Z-axis direction, a small-current unit 11B3 adjacent to the large-current unit 11A on a Z1 direction side, a small-current unit 11B1 adjacent to the large-current unit 11A on the Z1 direction side, and the large-current unit 11A are arranged on the same straight line C extending in the Z-axis direction. With this configuration, influence of the magnetism caused by current flowing through a bus bar 12 of the large-current unit 11A on a magnetic sensor 13 of the small-current unit 11B3 may be suppressed, and the current sensor 60 with a small measurement error may be attained.

Figure 7A:
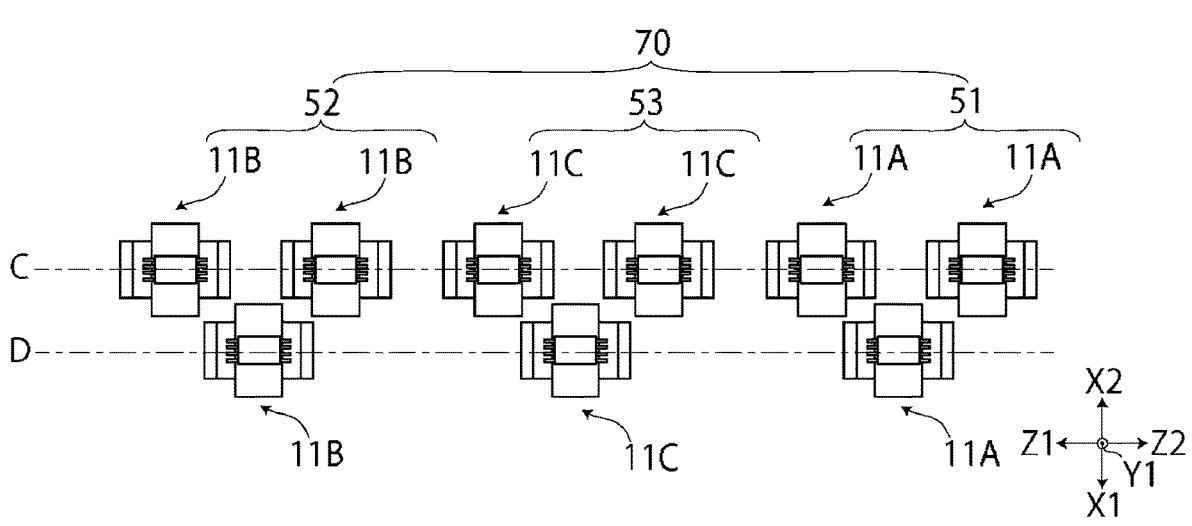
FIG. 7A is a plan view schematically illustrating the positional relationship of an important portion of a current sensor unit according to a modification.
Figure 7B:
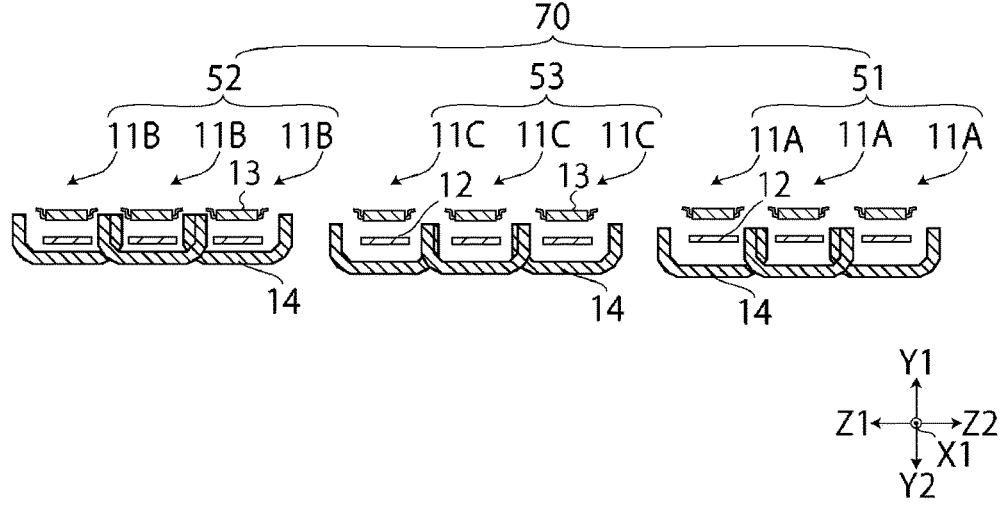
FIG. 7B is a cross-sectional view schematically illustrating the positional relationship of the important portion of the current sensor unit according to the modification.

FIG. 7A is a plan view schematically illustrating the positional relationship of an important portion of a current sensor 70 according to another modification, and FIG. 7B is a cross-sectional view thereof. The current sensor 70 is different from the current sensor 50 of FIG. 5 in a configuration in which a medium-current unit group 53 is further provided between a large-current unit group 51 and a small-current unit group 52. The medium-current unit group 53 includes medium-current units 11C in which current of a magnitude between a current value of current flowing through large-current units 11A and a current value of current flowing through small-current units 11B flows. Since the current sensor 70 includes, in addition to the large-current unit group 51 and the small-current unit group 52, the medium-current unit group 53, a range of measurable current is widened, and therefore, the current sensor 70 including the medium-current unit group 53 is more suitably used depending on a usage.

As with the large-current units 11A and the small-current units 11B, each of the medium-current units 11C includes a bus bar 12, a magnetic sensor 13, and a shield 14. The relative positional relationship of the components included in each of the medium-current unit 11C is the same as those of the large-current units 11A and the small-current units 11B.

Each of the medium-current units 11C has a distance L1 (refer to FIG. 1B) between the bus bar 12 and the magnetic sensor 13 in a Y-axis direction equal to the large-current units 11A and the small-current units 11B. The medium-current unit 11C has a distance L2 between the bus bar 12 and the shield 14 in the Y-axis direction (refer to FIG. 1B) smaller than those of the large-current units 11A and larger than that of the small-current units 11B. In this way, by adjusting the distance L2 according to a measurement current range, it is realized to measure current using the range that the magnetic sensor 13 can measure with the most accuracy even when different current ranges are measured.

Also in this case, the units 11 having different current values of current flowing through the bus bars 12 are arranged on the same straight line extending in a Z-axis direction. In other words, the large-current unit 11A and the medium-current unit 11C which are adjacent to each other in the Z-axis direction are arranged on the same straight line C, and the small-current unit 11B and the medium-current unit 11C which are adjacent to each other in the Z-axis direction are arranged on the same straight line C. With this configuration, influence of magnetism caused by relatively large current flowing through the bus bars 12 of the adjacent units 11 on the magnetic sensors 13 for measuring relatively small current may be suppressed by the shields 14. Therefore, the current sensor 70 with a small measurement error may be attained.

The embodiment disclosed herein is exemplary in all respects, and the present disclosure is not limited to this embodiment. The scope of the invention is shown by the scope of the claims rather than by the description of the above-described embodiment only, and it is intended to include all changes within the same meaning and scope as the scope of the claims.

EXAMPLES

First Example

Figure 8A:
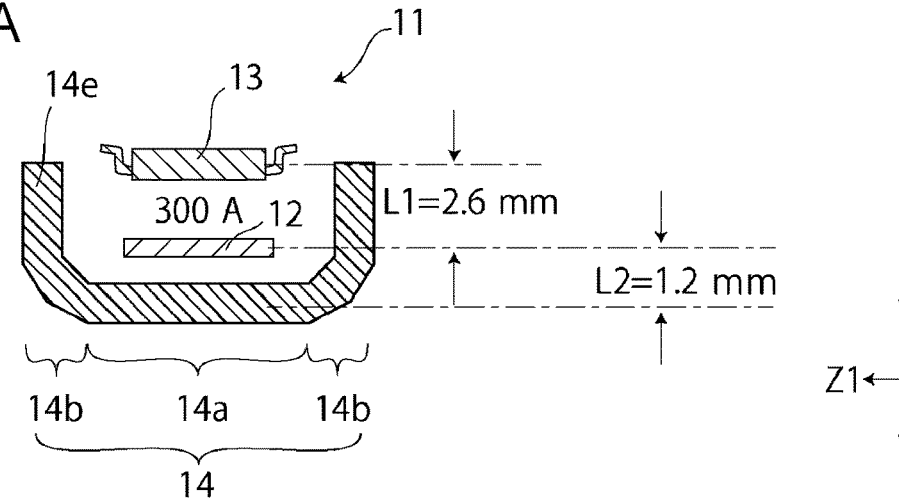
FIG. 8A is a cross-sectional view illustrating the positional relationship and a current value of an important portion of a current sensor unit according to a first example.
Figure 8B:
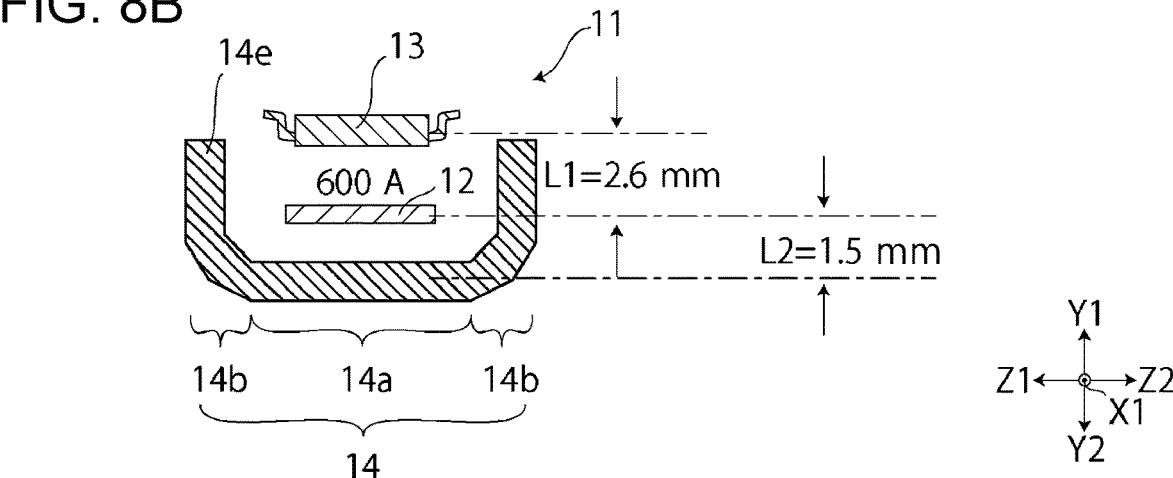
FIG. 8B is a cross-sectional view illustrating the positional relationship and a current value of the important portion of the current sensor unit according to the first example.
Figure 8C:
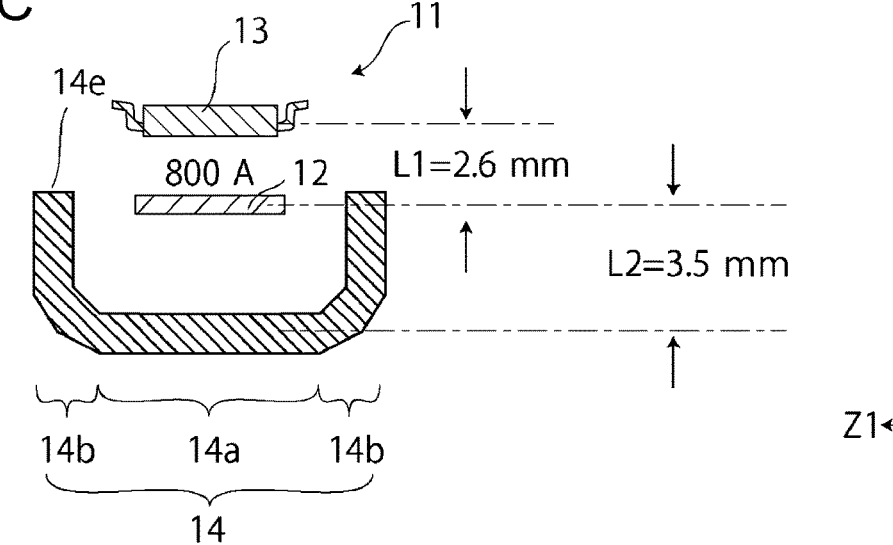
FIG. 8C is a cross-sectional view illustrating the positional relationship and a current value of the important portion of the current sensor unit according to the first example.

For a unit 11 having a configuration illustrated in FIGS. 8A to 8C, influence of a distance L1 between a bus bar 12 and a magnetic sensor 13 and a distance L2 between the bus bar 12 and a base 14a of a shield 14 on a magnetic flux density detected by the magnetic sensor 13 and an inner magnetic flux density of the shield 14 was measured in a Y-axis direction. In a first example, the shield 14 having a U-shape in a cross sectional view including standing portions 14b was used. Measurement was performed by applying currents of different sizes to the bus bar 12 of the unit 11 with a distance L1 of 2.6 mm and a distance L2 of a size illustrated in Table 2. In addition, as a first comparative example, a unit with a distance L1 of 2.6 mm and a distance L2 of 1.2 mm was measured in the same manner as the first example. Table 2 shows results of a magnetic flux density and a shield inner magnetic flux density measured and detected in the first example and the first comparative example.

TABLE 1

| Measurement | Example 1 | | Comparative Example 1 | |
|---|---|---|---|---|
| Current | L1 | L2 | L1 | L2 |
| 300 A | 2.6 mm | 1.2 mm | — | — |
| 600 A | 2.6 mm | 1.5 mm | 2.6 mm | 1.2 mm |
| 800 A | 2.6 mm | 3.5 mm | 2.6 mm | 1.2 mm |

TABLE 2

| | Example 1 | | Comparative Example 1 | |
|---|---|---|---|---|
| Measurement Current | Detected magnetic flux density | Magnetic flux density in shield | Detected magnetic flux density | Magnetic flux density in shield |
| 300 A | 38 mT | 0.7 T | — | — |
| 600 A | 65 mT | 1.4 T | 76 mT | 1.5 T |
| 800 A | 62 mT | 1.5 T | 102 mT | 2.0 T |

By changing the distance L2 between the bus bar 12 and the shield 14 as illustrated in Table 1, distribution of a magnetic field generated in the bus bar 12 was changed so that the magnetic flux density detected by the magnetic sensor 13 is 70 mT or less as illustrated in Table 2. Thus, by changing the distance L2 between the bus bar 12 and the shield 14, a distance from end portions 14e of the shield 14 located between the magnetic sensor 13 and the bus bar 12 to the magnetic sensor 13 may be adjusted. Therefore, by changing the distance L2 using the same shield 14, current having a magnitude which is undetectable when the distance L2 is not changed may be measured.

Furthermore, by changing the distance L2 between the bus bar 12 and the shield 14, ability to collect magnetism generated in the bus bar 12 by the shield 14 may be adjusted, and the magnetic flux density in the shield 14 may be suppressed, thereby suppressing the shield 14 from being magnetically saturated.

Figure 9:
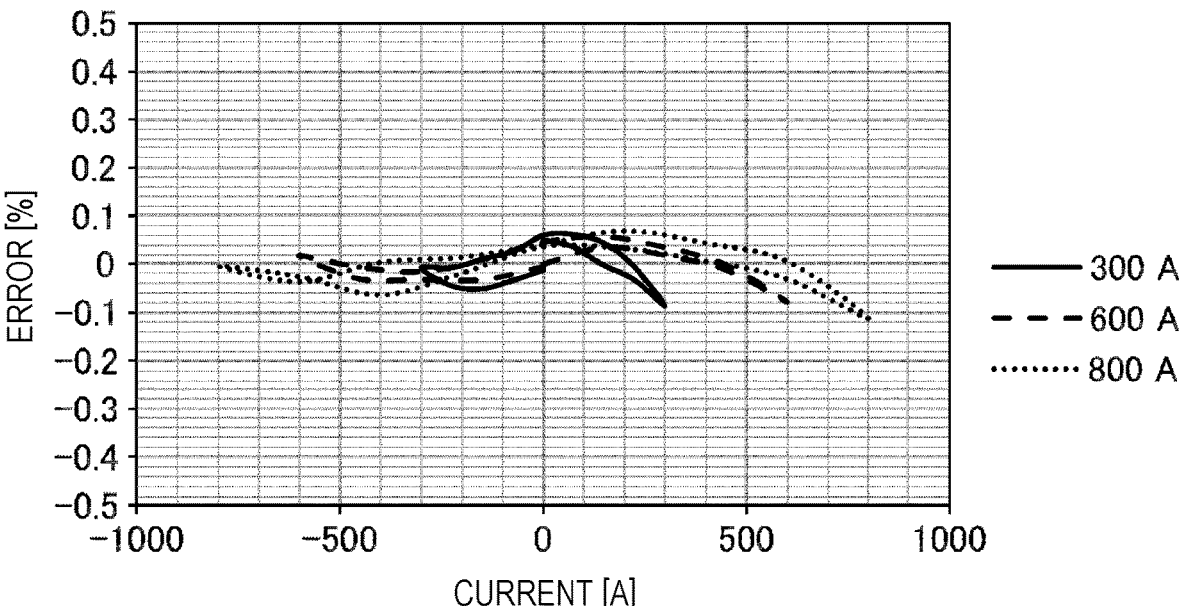
FIG. 9 is a graph illustrating results of the first example.

FIG. 9 is a graph of results of measurement performed by changing a direction of measurement target current flowing in the bus bar 12 in the first example. As illustrated in FIG. 9, an error of a measured current value was the same regardless of a magnitude of a detected current.

Second Example

For the current sensor 50 illustrated in FIG. 5A, a measurement error caused by current flowing through a bus bar 12 of an adjacent unit 11 was measured. As a large-current unit group 51 and a small-current unit group 52, the following configurations were used.

Large-Current Unit Group 51:

Current: 800 A

Distance L1: 2.6 mm, Distance L2: 3.5 mm (refer to FIG. 1B)

Interval a1: 12.5 mm (refer to FIG. 3)

Small-Current Unit Group 52:

Current: 300 A

Distance L1: 2.6 mm, Distance L2: 1.2 mm (refer to FIG. 1B)

Interval a2: 13.5 mm

Interval between Large-Current unit 11A1 and Small-Current Unit 11B3 Adjacent to Each Other: 17.5 mm Distance in X-Axis Direction between Straight Line C and Straight Line D (refer to FIG. 5A): 7.5 mm:

Third Example

Figure 10:
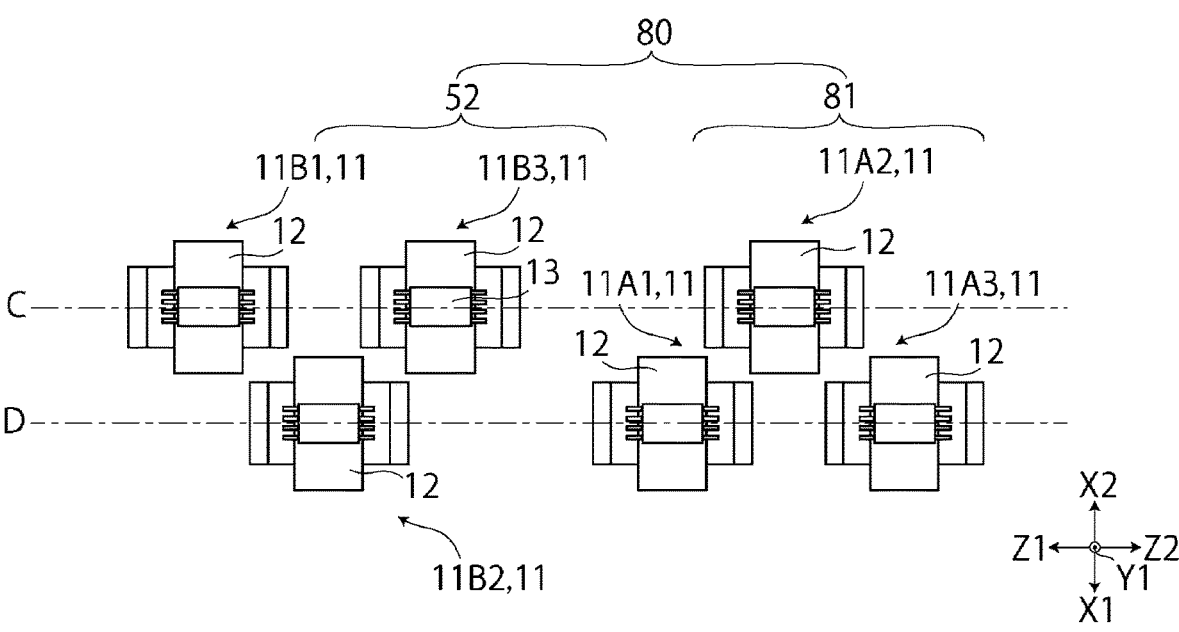
FIG. 10 is a plan view schematically illustrating the positional relationship of an important portion of a current sensor unit according to a current sensor unit of a third example.

For a current sensor 80 illustrated in FIG. 10, a measurement error caused by current flowing through a bus bar 12 of an adjacent unit 11 was measured. The current sensor 80 is different from the current sensor 50 of the second example in that the current sensor 80 includes a large-current unit 81 in place of the large-current unit group 51.

Only the arrangement of large-current units 11A is different between the large-current unit group 81 and the large-current unit group 51. Specifically, as illustrated in FIG. 10, large-current units 11A1 and 11A3 are arranged on opposite sides on a straight line D, and a large-current unit 11A2 is disposed on a straight line C between the large-current units 11A1 and 11A3.

Measurement results for the second and third examples are illustrated in Table 3.

TABLE 3

|  | Example 2 | Example 3 |
|---|---|---|
| Measurement error of large-current unit 11A1 (%) | 2.37 | 4.61 |
| Measurement error of small-current unit 11B3 (%) | 2.49 | 4.39 |

By arranging the large-current unit 11A1 and the small-current unit 11B3 on the same straight line as illustrated in the second example in FIG. 5A, a measurement error was made smaller than when the units were arranged on different straight lines as illustrated in the third example illustrated in FIG. 10.

As described above, the present invention is useful as a current sensor for measuring currents of different sizes in electric vehicles and hybrid vehicles having motors.

What is claimed is:

1. A current sensor comprising:
a plurality of units which are integrally formed, each unit including:
   a bus bar extending in a first direction and allowing a current to flow therethrough, the bus bar having a flat plate shape with a first plate surface and a second plate surface opposite to the first plate surface in a second direction normal to the first and second plate surfaces;
   a magnetic sensor disposed on one side of the bus bar so as to face the first plate surface; and
   a shield having a flat base and disposed on the other side of the bus bar such that the flat base faces the second plate surface,
wherein the plurality of units include at least one large-current unit for measuring a first range of current, and at least one small-current unit for measuring a second range of current smaller than the first range of current, the plurality of the units being arranged along a third direction orthogonal to the first direction and the second direction,
wherein a first distance between the bus bar and the magnetic sensor in the second direction in the large-current unit is the same as that in the small-current unit, while a second distance between the bus bar and the flat base in the second direction in the large-current unit is greater than that in the small-current unit, and wherein two adjacent units for measuring different current ranges are aligned on a same straight line extending in the third direction, and two adjacent units for measuring a same current range are staggered and arranged on different straight lines extending in the third direction.

2. A current sensor comprising:
a plurality of units which are integrally formed into an arrangement, each unit including:
   a bus bar extending in a first direction and allowing a current to flow therethrough, the bus bar having a flat plate shape with a first plate surface and a second plate surface opposite to the first plate surface in a second direction normal to the first and second plate surfaces;
   a magnetic sensor disposed on one side of the bus bar so as to face the first plate surface; and
   a shield having a flat base disposed on the other side of the bus bar such that the flat base faces the second flat surface,
wherein the plurality of units include a group of large-current units each configured to measure a first range of current, and a group of small-current units each configured to measure a second range of current smaller than the first range of current, and the group of large-current units and the group of small-current units are arranged along a third direction orthogonal to the first direction and the second direction,
wherein a first distance between the bus bar and the magnetic sensor in the second direction in the group of large-current units is the same as that in the group of small-current units, while a second distance between the bus bar and the flat base in the second direction in the group of large-current units is greater than that in the group of small-current units,
wherein the bus bars in the group of large-current units and the bus bars of the group of small-current units are arranged on a same plane,
and wherein adjacent large-current units within the group thereof are staggered and not aligned on a same straight line extending in the third direction, and adjacent small-current units within the group thereof are staggered and not aligned on a same straight line extending in the third direction, while one of the large-current units and one of the small-current units adjacent to each other are aligned on a same straight line extending in the third direction.

3. A current sensor comprising:
a plurality of units which are integrally formed, each unit including:
   a bus bar extending in a first direction and allowing a current to flow therethrough, the bus bar having a flat plate shape with a first plate surface and a second plate surface opposite to the first plate surface in a second direction normal to the first and second plate surfaces;
   a magnetic sensor disposed on one side of the bus bar so as to face the first plate surface; and
   a shield having a flat base disposed on the other side of the bus bar such that the flat base faces the second flat surface,
wherein the plurality of units include a large-current unit for measuring a first range of current, and a plurality of small-current units each for measuring a second range of current smaller than the first range of current, and the large-current unit and the plurality of small-current units are arranged along a third direction orthogonal to the first direction and the second direction, wherein a first distance between the bus bar and the magnetic sensor in the second direction in the large-current unit is the same as that in the plurality of small-current units, while a second distance between the bus bar and the base in the second direction in the large-current unit is greater than that in the plurality of small-current units, wherein the bus bar in the large-current unit and the bus bars in of the plurality of small-current units are arranged on a same plane, and wherein adjacent small-current units are staggered and not arranged on a same straight line extending in the third direction, and the large-current unit and at least one of the small-current units adjacent thereto are aligned on a same straight line extending in the third direction.

4. The current sensor according to claim 1, wherein the bus bar of the large-current unit and that of the small-current unit are identical at least in a portion thereof disposed between the magnetic sensor and the shield, and wherein the magnetic sensor and the shield in the large-current unit are identical to the magnetic sensor and the shield in the small-current unit, respectively.

5. The current sensor according to claim 1, wherein the shield in each unit includes a pair of standing portions extending in the second direction toward the magnetic sensor from opposite ends of the base plate in the third direction.

6. The current sensor according to claim 5, wherein respective ends of the standing portions of the shield are located between the magnetic sensor and the bus bar in second direction.

7. The current sensor according to claim 1, wherein the plurality of units comprises:

a first unit group including a plurality of large-current units arranged at an interval a1 in the third direction; and a second unit group disposed adjacent to the first unit group along the third direction, the second unit group including a plurality of small-current units arranged at an interval a2 in the third direction, wherein one of the large-current units closest to the second unit group and one of the small-current units closest to the first unit group are adjacent to each other with an interval b which is greater than both of the interval a1 and the interval a2, and wherein the bus bars in the plurality of large-current units and the bus bars in the plurality of small-current units are all arranged on a same plane.

8. The current sensor according to claim 1, further comprising:

at least one medium-current unit for measuring a third range of current smaller than the first range of current and greater than the second range of current.

* * * * *